United States Patent [19]

Sekihara et al.

[11] Patent Number: 4,993,075
[45] Date of Patent: Feb. 12, 1991

[54] IMAGE RECONSTRUCTION METHOD IN NMR IMAGING

[75] Inventors: Kensuke Sekihara, Musashimurayama; Kideki Kohno, Tama, both of Japan

[73] Assignee: Hitachi, Ltd., Tokyo, Japan

[21] Appl. No.: 375,725

[22] Filed: Jul. 5, 1989

[30] Foreign Application Priority Data

Jul. 6, 1988 [JP] Japan ................................. 63-166707

[51] Int. Cl.$^5$ ........................... G06K 9/00; G01V 3/00
[52] U.S. Cl. .................................... 382/6; 382/22; 324/309; 324/307
[58] Field of Search ..................... 382/6; 324/309, 307

[56] References Cited

U.S. PATENT DOCUMENTS

| 4,727,325 | 2/1988 | Matsui et al. | 324/309 |
| 4,745,364 | 5/1988 | Hatanaka | 324/309 |
| 4,797,616 | 1/1989 | Matsui et al. | 324/307 |

OTHER PUBLICATIONS

J. Phys. C: Solid State Phys., vol. 10, 1977, L55–L58.
Magnetic Resonance in Medicine 2, 1985, pp. 203–217.
Magnetic Resonance in Medicine 5, 1987, pp. 485–491.
Nature, vol. 272, Apr. 20, 1978, pp. 686–690.
Journal of Magnetic Resonance 67, 1986, pp. 476–490.

*Primary Examiner*—Leo H. Boudreau
*Assistant Examiner*—Steven P. Fallon
*Attorney, Agent, or Firm*—Antonelli, Terry, Stout & Kraus

[57] ABSTRACT

An image reconstruction method in an NMR imaging such as an echo-planar method, a fast Fourier imaging method or a fast spectroscopic imagin method is disclosed in which a spin-echo train is measured by use of an oscillating field gradient to obtain an actual measurement data train having a k-trajectory having positive and negative gradients on a k-space. A desired nuclear spin distribution is produced by establishing a predetermined trial image, subjecting each data in the trial image to a phase shift corresponding to the gradient of the k-trajectory and thereafter subjecting the phase-shifted trial image to inverse Fourier transformation to produce virtual measurement data trains which coincide in coordinates with the actual measurement data train, determining a difference between each data in the virtual measurement data train and the corresponding data in the actual measurement data train and making the sum of the absolute values of all of the differences or the sum of squares of the absolute values of all of the differences, and successively modifying the trial image so that the sum becomes small.

5 Claims, 6 Drawing Sheets

$F_P(kx, ky)$ $F_N(kx, ky)$

IMAGE RECONSTRUCTION METHOD IN NMR IMAGING

BACKGROUND OF THE INVENTION

The present invention relates to a fast NMR (nuclear magnetic resonance) imaging method, and more particularly to an image reconstruction method based on an echo-planar method or the like.

The echo-planar method is described in J. Phys. C: Solid State Physics, Vol. 10, pp. L55–L58, 1977. In this method, the amplitude $G_X$ of an oscillating field gradient and the amplitude $G_Y$ of a steadily applied field gradient satisfy the relation of $$G_X = 2MG_Y \quad (1)$$

where M is the size of an image matrix. (The image matrix includes M×M pixels.) It is assumed that the dimensions of each of a field of view and a pixel in x and y directions are equal to each other.

It is said that the order of 0.2 gauss/cm is usually required for $G_Y$. Provided that M is 128, 51.2 gauss/cm is required for $G_X$. However, the switching of the field gradient having such a large amplitude is practically almost impossible.

In order to solve the above-mentioned problem, a method called a fast Fourier imaging is proposed in Magnetic Resonance in Medicine, Vol. 2, pp. 203–217, 1985.

In the echo-planar method, an image can be reconstructed in principle by one signal measurement subsequent to the application of a 90° pulse. On the other hand, in a generally used Fourier imaging, M measurements are required. The fast Fourier imaging method is a compromise between the echo-planar method and the Fourier imaging. Namely, in the fast Fourier imaging method, though N measurements satisfying a relation of $1 \leq N \leq M$ are required, the requirement on the amplitudes of field gradients corresponding to the equation (1) is moderated or $$G_X = \frac{2M}{N} G_Y \quad (2)$$

In the case of the above-mentioned numerical example for $G_Y$ and M, 1.6 gauss/cm is required for $G_X$ when N is 32. It is practically difficult even to realize this value of $G_X$. In order to realize a practical range of $G_X < 1$ gauss/cm, N must be selected to be equal to or greater than 64 in the above-mentioned numerical example for $G_Y$ and M. The value of 64 for N is only a half of 128 which is the number of times of measurement in the Fourier imaging.

As an example most relevant to the present invention is known a method described in the article written by the present inventors and reported in Magnetic Resonance in Medicine, Vol. 5, pp. 485-491, 1987. In this method, each of the amplitude and frequency of an oscillating field gradient can be reduced to half by making an image reconstruction through the simultaneously combined use of a group of echoes obtained when the field gradient is positive and a group of echoes obtained when the field gradient is negative. However, in this method, since a division process is introduced in the course of calculation, there is a drawback of the increase in noise in a final reconstructed image. This increase in noise is discussed in detail in the above-mentioned article.

SUMMARY OF THE INVENTION

An object of the present invention is to provide an image reconstruction method in which each of the amplitude and frequency of a field gradient in an echo-planar method of a fast Fourier imaging method is reduced to half with no increase in noise in a final reconstructed image, thereby making it possible to easily realize fast (high-speed) imaging.

In the conventionally known image reconstruction method base on the echo-planar method or the fast Fourier imaging method, an image is reconstructed by individually combining a group of echoes produced when a field gradient is applied with its positive amplitude and a group of echoes produced when the field gradient is applied with its negative amplitude. In the above-mentioned article written by the present inventors, there is proposed a method in which an image is reconstructed by the simultaneous use of those echo groups to further halving the requirements on the amplitude of an oscillating field gradient, for example, so that the requirement in the fast Fourier imaging method is $$G_X = \frac{M}{N} G_y \quad (2)'$$

However, this method has a drawback that noise in a final reconstructed image is increased.

In the present invention, it is intended to reduce each of the amplitude and frequency of an oscillating field gradient to half by reconstructing an image through the combination of the above-mentioned two groups of echoes without increasing noise in an image.

The present invention will now be explained.

FIG. 1A shows the trajectory of data points in a spatial frequency domain when an echo-planar method is performed. As shown, the trajectory is expressed by a zig-zag line. Here, $k_x$ and $k_y$ are the spatial angular frequencies for x and y directions. According to the conventional image reconstruction method, the data points on the trajectory are classified into a group of data points on lines having rightward ascent as shown in FIG. 1B and a group of data points on lines having leftward ascent as shown in FIG. 1C and these data point groups are individually subjected to Fourier transformation. In this case, the interval $\Delta k_y$ between the data grid points in the $k_y$ direction is expressed by $$\Delta k_y = \gamma G_y (4T_W) \quad (3)$$

when period of oscillating field gradient is $4T_W$. Here, $\gamma$ is the gyromagnetic ratio. The width $L_Y$ of a field of view in the y direction is expressed by $$L_Y = \frac{2\pi}{\Delta k_y}. \quad (4)$$

Also, when the size of a pixel is P, the relation of $$P = \frac{2\pi}{\gamma G_X(2T_W)} \quad (5)$$

exists. As a result, the following relation should be satisfied:

$$G_X = 2\frac{L_Y}{P} G_y = 2MG_Y. \qquad (1)$$

The present invention relates to a method in which the data points on lines having rightward ascent and the data points having leftword ascent as mentioned above are simultaneously used, thereby making it possible to reconstruct a correct image even in the case where the amplitude of the oscillating field gradient is reduced to half or in the case of $G_X = MG_Y$.

Now consider that a group of data acquired in periods when the oscillating field gradient is positive, as shown in FIG. 1B, is represented by $F_P(k_x, k_y)$ and a group of data acquired in periods when the oscillating field gradient is negative, as shown in FIG. 1C, is represented by $F_N(k_x, k_y)$. In the present invention, a certain trial image is represented by $m(x, y)$ and $M_P(k_x, k_y)$ and $M_N(k_x, k_y)$ according to the following equations (6) and (7) are firstly calculated:

$$M_P(k_x, k_y) = \int m(x, y)\exp[i(\eta y + xk_x + yk_y)]dxdy \qquad (6)$$

and $$M_N(k_x, k_y) = \int m(x, y)\exp[i(\eta y = xk_x - yk_y)]dxdy. \qquad (7)$$

Here, $\eta$ is equal to $(G_y/G_x)k_x$ when the oscillating field gradient is driven with a rectangular waveform, and $G_x$ and $G_y$ represent the amplitudes of field gradients in x and y directions, respectively.

When the data point interval $\Delta k_y$ of each of $F_P(k_x, k_y)$ and $F_N(k_x, k_y)$ in the y direction is equal to $4\pi/L_y$ where $L_y$ is the width of a field of view in the y direction. The value of $\Delta k_y$ is twice as great as the requirement from the sampling theory. On the other hand, since $m(x, y)$ is defined in a range of $-L_y/2 \leq y \leq L_y/2$, $M_P(k_x, k_y)$ and $M_N(k_x, k_y)$ obtained from the equations (6) and (7) are determined through calculation as discrete points which have an interval of $k_y/2$ with respect to the y direction. Accordingly, an index $\chi^2$ indicative of the degree of coincidence of $m(x, y)$ with measured data (or actual measurement data) is calculated by the following equation:

$$\chi^2 = \frac{1}{\sigma^2} \sum_{k_x} \sum_{n=0}^{M/2-1} \left[ \left| M_P\left(k_x, 2\eta \frac{\Delta k_y}{2}\right) - F_P(k_x, \eta\Delta k_y) \right|^2 + \left| M_N\left(k_x, (2\eta + 1) \frac{\Delta k_y}{2}\right) - F_N(k_x, \eta\Delta k_y) \right|^2 \right] \qquad (8)$$

where $\sigma$ is the rms value of noise included in the measured data.

A final estimated image is determined in such a manner that the trial image $m(x, y)$ is successively modified so that the index $\chi^2$ takes the minimum value. Widely known standard methods including a steepest descent method and a conjugate gradient method can be used for determination of such an estimated image.

In usual, data acquired by use of the echo-planar method have a poor S/N ratio. In that case, it is practical that the present invention is used in combination with a maximum entropy method. In this method, the estimated image $m(x, y)$ is determined so as to maximize the entropy S of the estimated image $m(x, y)$ while constraining $\chi^2$ to values in a certain range. According to this method, a noise-suppressed image can be reconstructed without sacrificing the resolution. The definition of the image entropy and the image reconstruction using the maximum entropy method are described in, for example, Nature, Vol. 272, No. 20, pp. 686–690, Apr. 1978.

In the case where the S/N ratio of the measured data is much poor, $m(x, y)$ may be determined in such a manner that the square D of the sum of the second-order differentials of the trial image with respect to x and y as calculated by $$D = \sum_x \sum_y \left[ \frac{\partial^2 m(x, y)}{\partial x^2} + \frac{\partial^2 m(x, y)}{\partial y^2} \right]^2 \qquad (9)$$

is minimized while constraining $\chi^2$ to values in a certain range. However, the thus determined $m(x, y)$ has a considerably deteriorated resolution though noise is extremely suppressed.

DESCRIPTION OF THE PREFERRED EMBODIMENTS

Embodiments of the present invention will now be explained by virtue of the accompanying drawings.

Figure 2:
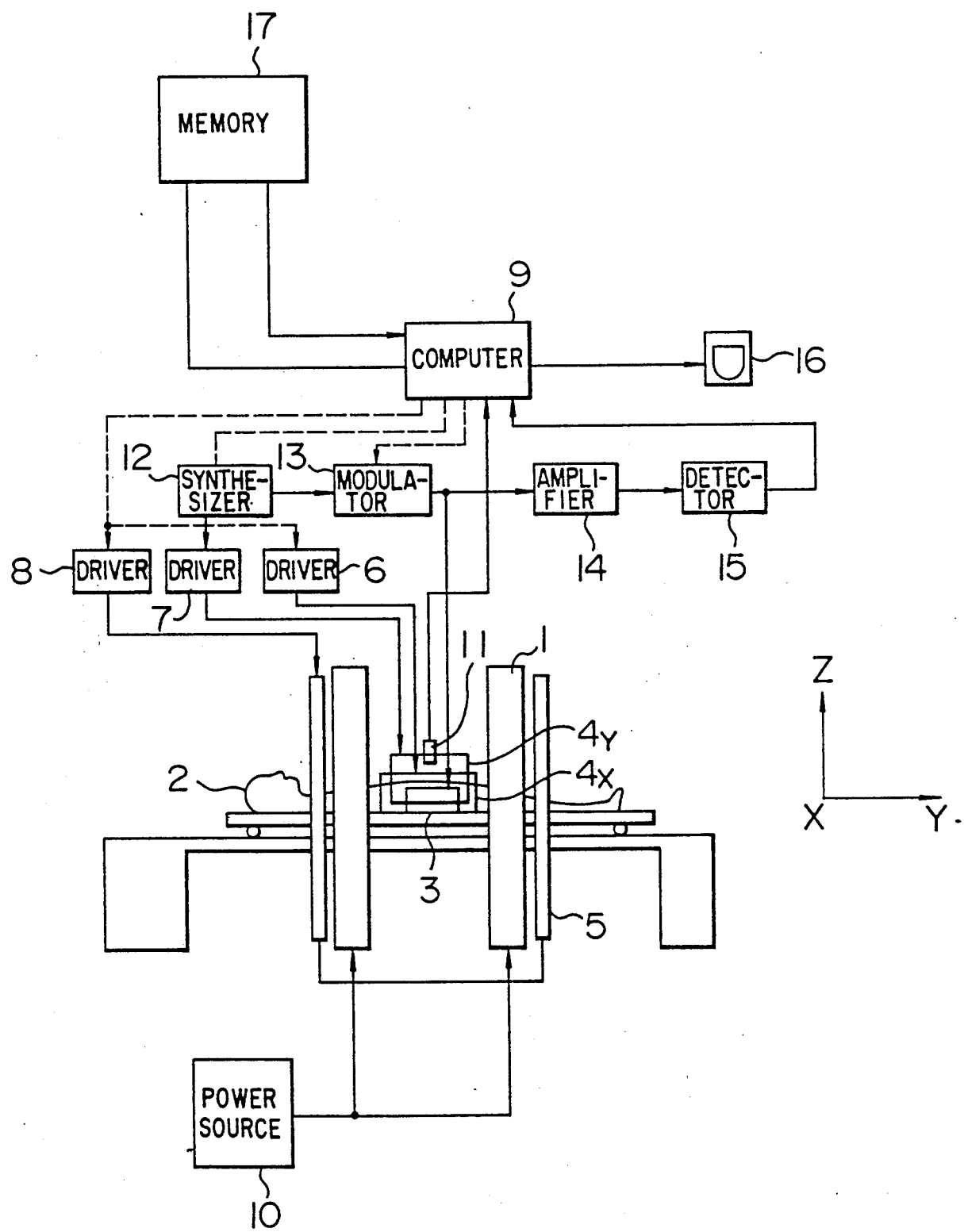
FIG. 2 is a block diagram showing an example of the construction of a system embodying the present invention.

FIG. 2 is a block diagram showing the schematical construction of an examining system using a nuclear magnetic resonance phenomenon (hereinafter referred to simply as "examining system") according to an embodiment.

In FIG. 2, reference numeral 1 designates an electromagnet for generating a static magnetic field $H_0$, numeral 2 an object to be examined, numeral 3 a coil for generating a high frequency (RF) magnetic field and detecting a signal produced from the object 2 to be examined, and numerals $4_X$, $4_Y$ and 5 field gradient generating coils for generating field gradients in X, Y and Z directions, respectively. The field gradient generating coil 5 includes circular line rings wired so that currents having their directions reverse to each other flow therethrough. Reference numerals 6, 7 and 8 designate drivers for supplying currents to the field gradient generating coils $4_X$, $4_Y$ and 5, respectively. Reference numeral 9 designates a computer, numeral 10 a power source for the static magnetic field generating electromagnet 1, and numeral 11 a measuring device for measuring the volume of the object 2 to be examined. The magnitude of the field gradient generated from each of the field gradient generating coils $4_X$, $4_Y$ and 5 can be changed by an command from the object volume measuring device 11.

Next, the operation of the present examining system will be briefly explained.

The RF magnetic field for exciting nuclear spins of the object 2 to be examined is generated in such a manner that a high frequency generated by a synthesizer 12 is waveform-shaped and power-amplified by a modulator 13 to supply a current to the coil 3. A signal from the object 2 to be examined is received by the coil 3, passed through an amplifier 14, orthogonally detected by a detector 15 and inputted to the computer 9. The computer 9 performs signal processing and thereafter displays on a CRT display 16 an image corresponding to a nuclear spin density distribution or a relaxation time distribution. Reference numeral 17 in FIG. 2 designates a memory for storing data in the course of calculation or final data.

Figure 1A:
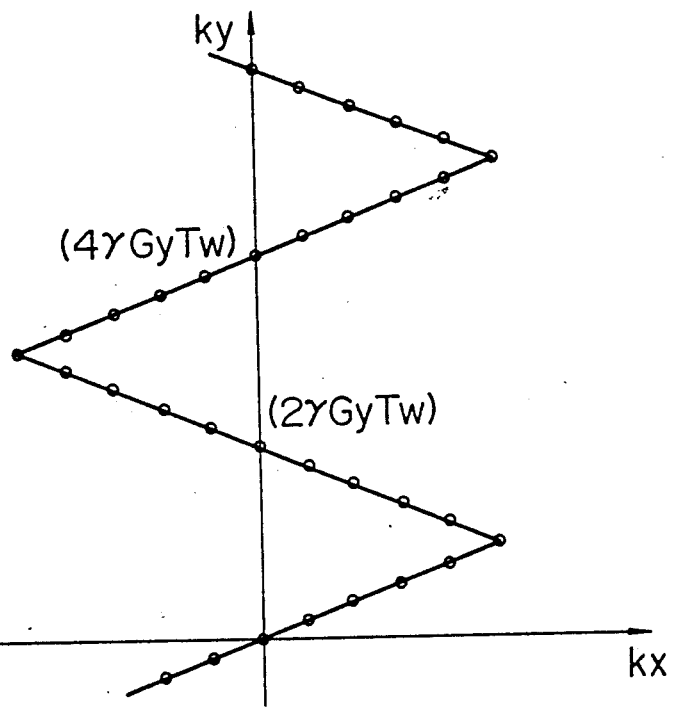
FIGS. 1A to 1C are conceptual views showing the trajectory in a k-space (or spatial frequency domain) of data points obtained in an embodiment of the present invention.
Figure 3:
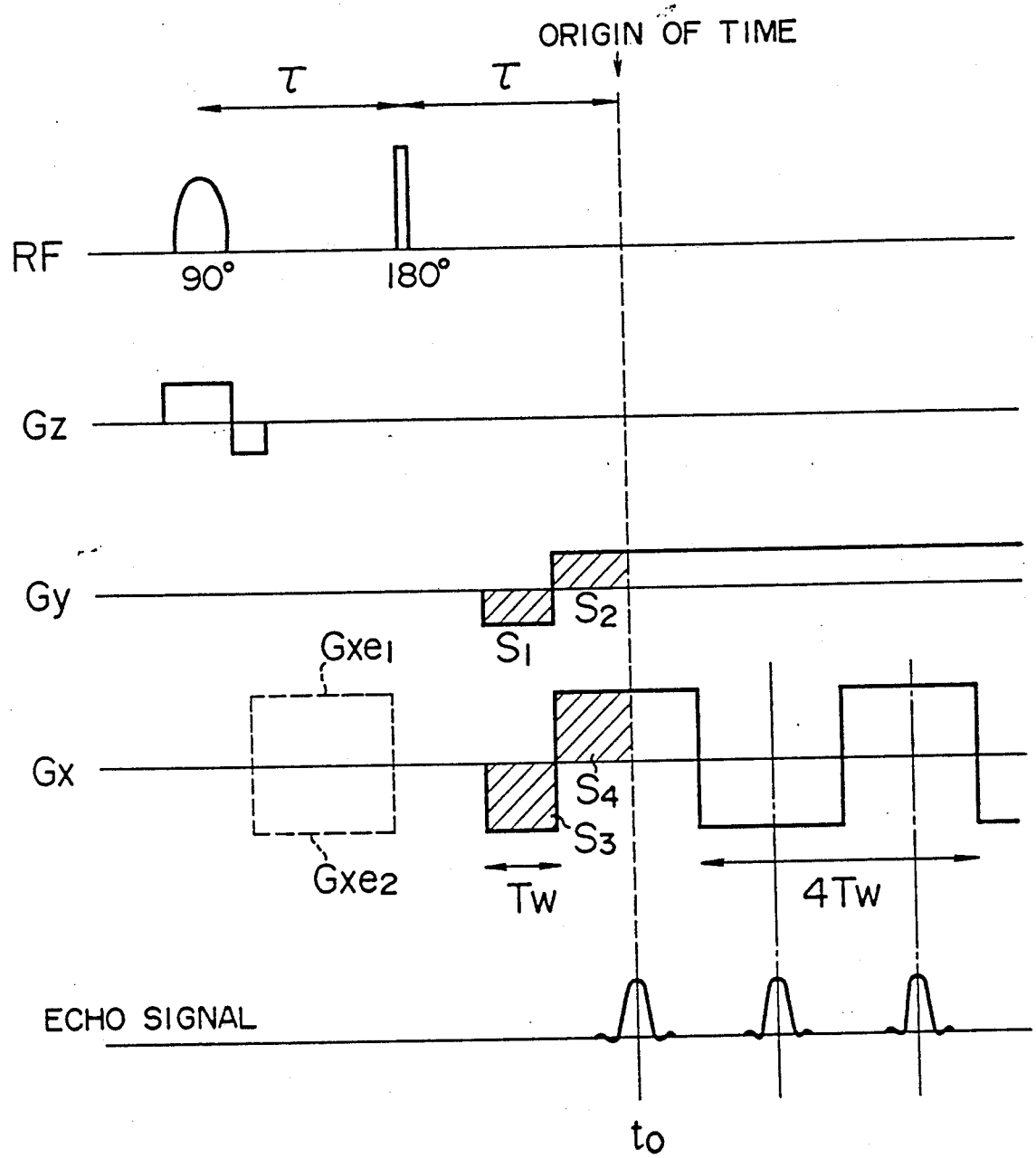
FIG. 3 is a time chart showing a pulse sequence used in the embodiment.

FIG. 3 shows a measurement sequence used in the present embodiment. This measurement sequence is known in an echo-planar method. First, in a state in which a field gradient $G_z$ in the z direction is applied, a 90° RF pulse is generated to excite nuclear spins in a since at a desired position in the z direction. Next, a 180° RF pulse is generated to invert the direction of the spins. A time difference between the center point of the 90° RF pulse and the center point of the 180° RF pulse is $\tau$. Accordingly, the peak of a barn echo of the nuclear spins in the above-mentioned slice appears at instant of time $t_0$ after the lapse of the time $\tau$ from the center point of the 180° RF pulse. The read-out of an NMR signal or the operation of taking a signal from the detector 15 into the computer 9 through sampling is carried out with the time instant $t_0$ taken as the origin of time. During this read-out period, a field gradient $G_y$ in the y direction having a constant magnitude and a field gradient $G_x$ in the x direction oscillating with a constant amplitude at a constant period $4T_W$ are applied. Thereby, a plurality of spin echoes are successively measured. Since it is difficult to generate a field gradient which rises instantaneously at the time instant $t_0$, the field gradient $G_y$ or $G_x$ is generated with its sense inverted on the way so that the integral values $S_1$ and $S_2$ (or $S_3$ and $S_4$) of intensity of the field gradient in opposite directions are equal to each other. Namely, the phase rotations of the static magnetic field, the field gradient in the x direction and the field gradient in the y direction are all zero at the time instant $t_0$. By such a measurement sequence, a train of data on a trajectory in a spatial frequency domain as shown in FIG. 1A is obtained.

Figure 4:
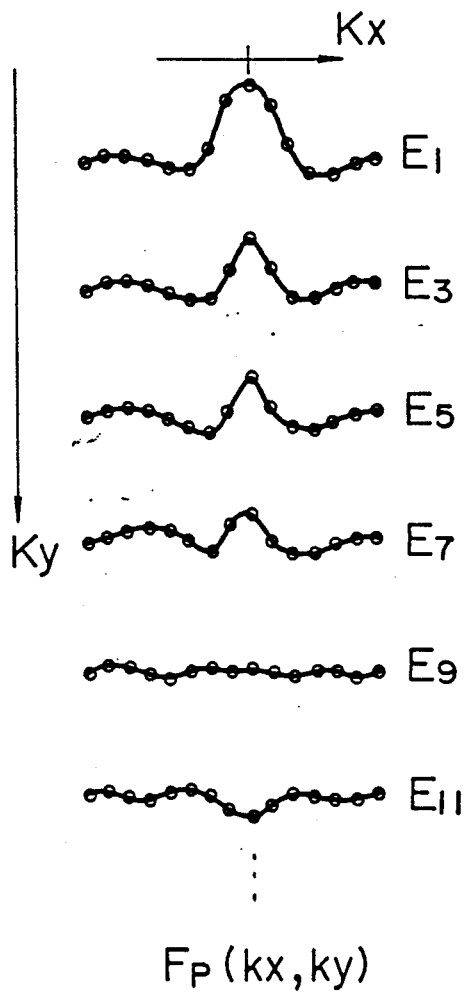
FIG. 4 is a conceptual view showing a two-dimensional data array constructed by a group of odd-numbered echoes in the embodiment.
Figure 5:
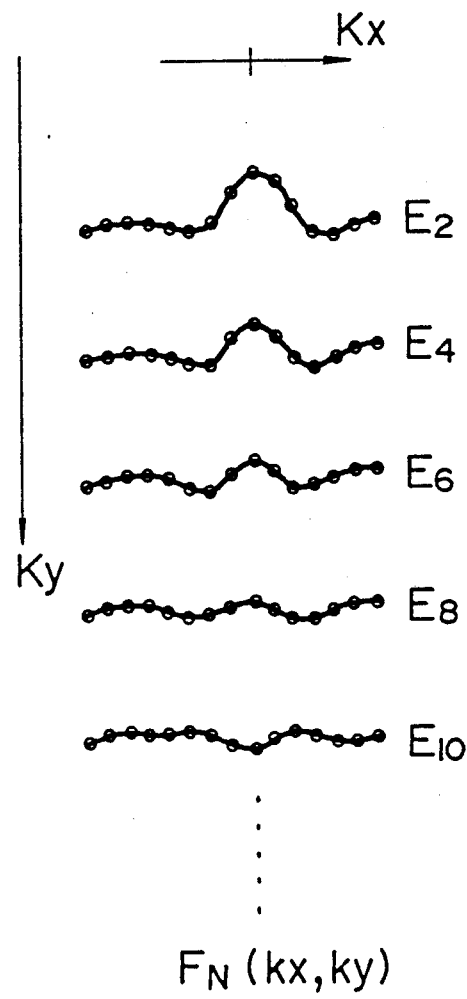
FIG. 5 is a conceptual view showing a two-dimensional data array constructed by a group of even-numbered echoes in the embodiment.
Figure 6:
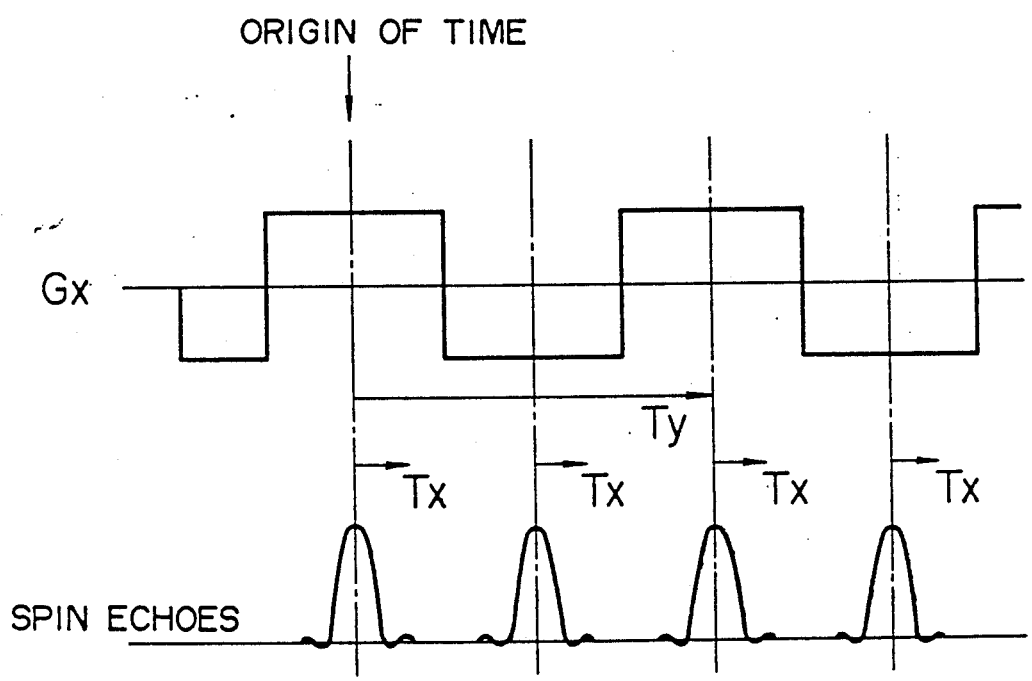
FIG. 6 is a view for explaining $T_x$ and $T_y$.

In the computer 9, the actual measurement data train thus obtained is classified into a train of data in periods when $G_x$ is positive or a data train representative of a group of odd-numbered echoes and a train of data in periods when $G_x$ is negative or a data train representative of a group of even-numbered echoes to provide respective two-dimensional data arrays. FIG. 4 shows a data array produced from the odd-numbered echoes and FIG. 5 shows a data array produced from the even-numbered echoes. Here, $k_x$ and $k_y$ are the spatial angular frequencies (or the versions of spatial frequencies multiplied by $2\pi$) in the x and y directions, and they are defined by $k_x = \gamma G_x T_x$ and $k_y = \gamma G_y T_y$. As shown in FIG. 6, $T_x$ is a time measured from the center of the echo and $T_y$ is a time measured from the origin of time (see FIG. 3).

Let us represent the data array as shown in FIG. 4 produced from the odd-numbered echoes by $F_P(\mu, \nu)$ and the data array as shown in FIG. 5 produced from the even-numbered echoes by $F_N(\mu, \nu)$ where $\mu$ and $\nu$ are $k_x$ and $k_y$ represented by discrete quantities as follows:

$$\mu = 0, 1, \ldots, M - 1$$

and $$\nu = 0, 1, \ldots, \frac{M}{2} - 1.$$

Figure 1B:
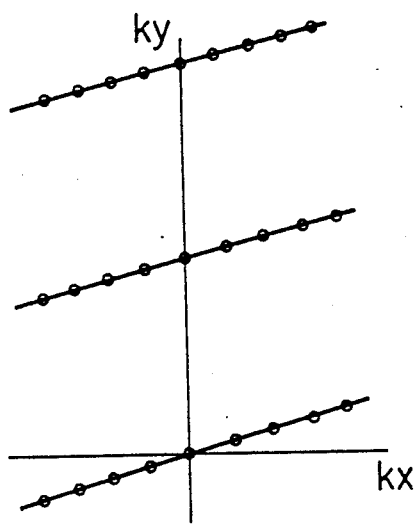
Figure 1C:
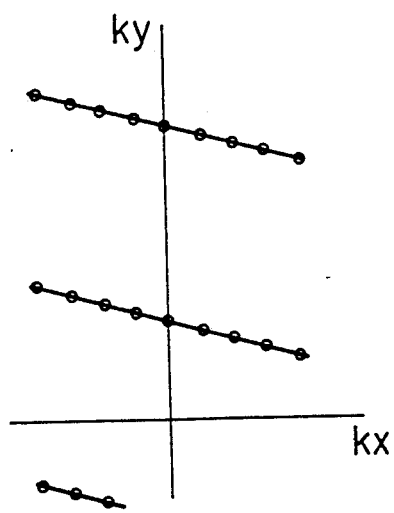

$F_P(\mu, \nu)$ and $F_N(\mu, \nu)$ correspond to the data arrays shown in FIGS. 1B and 1C, respectively.

Since $G_x$ is selected to satisfy the relation of $G_x = MG_y$, the minimum data interval $\Delta k_y$ of each of $F_P(\mu, \nu)$ and $F_N(\mu, \nu)$ in the $k_y$ direction has a value twice as large as the requirement from the sampling theory and it has the relation of $\Delta k_y = 4\pi/L_y$ with respect to the width $L_y$ of a field of view in the y direction. Accordingly, if $F_P(\mu, \nu)$ and $F_N(\mu, \nu)$ are Fourier-transformed with respect to $k_x$ and $k_y$ as they are, the results of Fourier transformation cause convolution in the y direction.

This convolution can be removed according to the present invention. In the following, the present invention will be exemplarily explained in conjunction with the case where it is combined with a maximum entropy method which may be considered as being most practical. Now consider that a trial image is $m(I, J)$ where I and J are the versions of coordinates (x, y) represented by discrete quantities and each of I and J is equal to 0, 1, ..., M-1. Virtual or imaginary measurement data trains $M_P(\mu, \nu)$ and $M_N(\mu, \nu)$ are calculated from (I, J) in accordance with the following equations (10) and (11) corresponding to the equations (6) and (7):

$$M_P(\mu, \nu) = \frac{1}{N^2} \sum_{I,J} m(I,J) e^{i\xi(\mu, J)} e^{i\pi(\mu I + \nu J)/N} \quad (10)$$

and $$M_N(\mu, \nu) = \frac{1}{N^2} \sum_{I,J} m(I,J) e^{i\xi(\mu, J)} e^{i\pi(-\mu I + \nu J)/N} \quad (11)$$

where $\mu = 0, 1, \ldots, M-1$ and $\nu = 0, 1, \ldots, M-1$. $\xi(\mu, J)$ is represented by $$\xi(\mu, J) = \eta \Delta y \left( J - \frac{M}{2} \right) \quad (12)$$

where $\Delta y$ is the size of a pixel in the y direction. Since $$\eta = (G_y/G_x)\Delta k_y \left( \mu - \frac{M}{2} \right) \text{ and } \Delta k_x = \frac{2\pi}{L_x},$$

we ultimately have $$\xi(\mu, J) = 2\pi \frac{\Delta y}{L_x} \left( J - \frac{M}{2} \right)\left( \mu - \frac{M}{2} \right).$$

If $\Delta x = \Delta y$ and $L_x = L_y$ for a reproduced image, we have $$\xi(\mu, J) = 2\pi \left(J - \frac{M}{2}\right)\left(\mu - \frac{M}{2}\right)/M. \quad (13)$$

The trial image m(I, J) has pixels which lie in an orthogonal matrix on a real domain. Accordingly, if the trial image is subjected to inverse Fourier transformation as it is, there results in a train of data lying in an orthogonal matrix on the k-space. On the other hand, the virtual measurement data train $M_P(\mu, \nu)$ following the equation (10) results from inverse Fourier transformation of the trial image m(I, J) after having been subjected to a phase shift $\xi(\mu, J)$ corresponding to the gradient of the k-trajectory of the actual measurement data train shown in FIG. 1B. Therefore, the virtual measurement data train $M_P(\mu, \nu)$ has a rightward ascending gradient, like the k-trajectory shown in FIG. 1B. The virtual measurement data train $M_N(\mu, \nu)$ following the equation (11) is the result of inverse Fourier transformation of a version of the trial image m(I, J) with the inverted sign of I after having been subjected to the above-mentioned phase shift and hence this data train has a rightward descending gradient, like the k-trajectory shown in FIG. 1C. Accordingly, though $M_P(\mu, \nu)$ and $M_N(\mu, \nu)$ are virtual data trains obtained from the pre-established trial image independently from the actual measurement data, a train of odd-numbered data in $M_P(\mu, \nu)$ exists on the same coordinates as $F_P(\mu, \nu)$ of the actual measurement data trains and a train of data in even-numbered data in $M_N(\mu, \nu)$ exists on the same coordinates as the actual measurement data train $F_N(\mu, \nu)$. Therefore, an index indicative of the degree of coincidence of the virtual measurement data train with the actual measurement data train can be defined by determining a difference between each data of $F_P(\mu, \nu)$ and the corresponding data of $M_P(\mu, \nu)$ and a difference between each data of $F_N(\mu, \nu)$ and the corresponding data of $M_N(\mu, \nu)$ and making the sum of the absolute values of all of the differences or the sum of squares of the absolute values of all of the differences. An equation for determining the index $\chi^2$ from the sum of squares is as follows:

$$\chi^2 = \sum_{\mu=0}^{M-1} \sum_{n=0}^{M/2-1} [|M_P(\mu, 2n) - F_P(\mu, n)|^2 + \quad (14)$$

$$|M_N(\mu, 2n+1) - F_N(\mu, n)|^2]$$

The trial image m(I, J) is modified so that the index $\chi^2$ becomes small, and the same calculation is repeated by use of the modified trial image, thereby sequentially making the value of $\chi^2$ small. An estimated image thus obtained results in a spin distribution on a real domain corresponding to the actual measurement data.

According to a concrete method of modifying the trial image, m(I, J) maximizing $$S = -\sum_I \sum_J |m(I, J)| \log |m(I, J)| \quad (15)$$

while constraining the value of $\chi^2$ in a range of $\chi^2 \leq \chi_L$ is selected as a new trial image m(I, J). This is equivalent to the selection of m(I, J) which maximizes $Q = S - \lambda_{10}2^2$ where $\lambda$ is a positive multiplier. A method of determining such m(I, J) is described in detail in, for example, the Japanese book entitled "Non-Linear Programming", written by Hiroshi Konno and Hiroshi Yamashita and published by Nikkagiren Publishing Co., Ltd. (1978), and the Japanese book entitled "Optimization" written by Kazuya Nishikawa and published by Morikita Publishing Co., Ltd. The following explanation will be exemplarily made in conjunction with a method using a steepest descent method which is the most standard technique.

In the steepest descent method, a gradient $\partial Q/\partial m$ is calculated. The calculation is made on the basis of $$\frac{\partial Q}{\partial m} = \frac{\partial S}{\partial m} - \lambda \frac{\partial \chi^2}{\partial m}.$$

But, since m(I, J) is a complex number, m(I, J) is represented as $$m(I, J) = m_1(I, J) + i m_2(I, J)$$

and the calculation is made separately for $\partial Q/\partial m_1$ and $\partial Q/\partial m_2$. $\partial S/\partial m_1$ and $\partial S/\partial m_2$ are as follow:

$$\frac{\partial S}{\partial m_1} = (1 + \log |m(I, J)|) \frac{m_1(I, J)}{|m(I, J)|} \quad (16)$$

$$\frac{\partial S}{\partial m_2} = (1 + \log |m(I, J)|) \frac{m_2(I, J)}{|m(I, J)|}. \quad (17)$$

$\frac{\partial \chi^2}{\partial m_1}$ and $\frac{\partial \chi^2}{\partial m_2}$ are as follows:

$$\frac{\partial \chi^2}{\partial m_1} = \frac{2}{N^2 \sigma^2} Re[A(I, J)] \quad (18)$$

$$\frac{\partial \chi^2}{\partial m_2} = \frac{2}{N^2 \sigma^2} Im[A(I, J)] \quad (19)$$

where $$A(I, J) = \sum_\mu \sum_n [(M_P - F_P)e^{-i\xi(\mu, J)}e^{-i2\pi(\mu I + \nu J)/N} + \quad (19)'$$

$$(M_N - F_N)e^{-i\xi(\mu, J)}e^{-i2\pi(\mu I + \nu J)/N}].$$

Then, $$\Delta Q = \sum_{I,J} \frac{\partial Q}{\partial m} \cdot \delta m$$

is calculated from $\partial Q/\partial m$ determined from the above equations. At this time, $\delta m(I, J)$ is selected through one-dimensional search so that $\Delta Q$ takes the maximum value. A method which can be used for the one-dimensional search includes a golden section method and a secondary interpolation method which are described in detail in the above-mentioned references "Non-Linear Programming" and "Optimization". The procedure in the present invention can be summarized as follows:

(1) m(I, J) having a certain constant irrespective of coordinates I and J is established as an initial value of the trial image m(I, J).

(2) m(I, J) is used to calculate $$\frac{\partial Q}{\partial m(I, J)}$$

by means of the equations (14) to (17).

(3) The one-dimensional search method (for example, the secondary interpolation method) is used to select $\delta m(I, J)$ which minimizes $$\Delta Q = \sum_{I,J} \frac{\partial Q}{\partial m(I, J)} \delta m(I, J).$$

(4) $m(I, J) + \delta m(I, j)$ is taken as a new trial image $m(I, J)$.

(5) $\chi^2$ is calculated by use of the equations (10), (11) and (12) to examine whether or not $\chi^2 \leq \chi_L$ is satisfied. Here, $\chi_L$ is usually selected to be equal to the number of measured data. (In the present embodiment, $X_L$ is $2N^2$.) However, $\chi_L$ is not limited to such a value. In general, a solution in which weight is attached to the maximum entropy is obtained if $\chi_L$ is made large, and a solution in which weight is attached to the coincidence with the measured data is obtained if $\chi_L$ is made small.

(6) In the case where $\chi^2 < \chi_L$ is not satisfied, the process is returned to (2) and a similar procedure is repeated. On the other hand, in the case where $\chi^2 < \chi_L$ is satisfied, S is calculated by use of the equation (13). If a difference $\Delta S$ between this value of S and the value of S in the preceding cycle is not greater than a certain value $E_P(\Delta S \leq E_P)$, the calculation is discontinued and $m(I, J)$ at that time is employed as a final estimated imate. If $\Delta S > E_P$, the process is returned to (2) to repeat the calculation again.

The multiplier $\lambda$ has a function of adjusting whether $m(I, J)$ is obtained attaching weight to the maximum entropy or attaching weight to the coincidence with the measured data. It is known that $\chi^2$ converges into a smaller value if $\lambda$ is made large while $\chi^2$ converges into a larger value if $\lambda$ is made small. Accordingly, it is necessary to determine the value of $\lambda$ by experience so that $\chi^2$ substantially converges into $\chi_L$ and to start the above-mentioned repetitive calculation with $\lambda$ set to the determined value.

It is apparent that the present invention may be used even in the case where an oscillating field gradient is used which is similar to the waveform shown in FIG. 3 but has positive and negative signs interchanged. In this case, however, the equation (12) should be changed to $$\chi^2 = \sum_{\mu=0}^{M-1} \sum_{n=0}^{M/2-1} [|M_P(\mu, 2n + 1) - F_P(\mu, n)|^2 + \quad (20)$$

$$|M_N(\mu, 2n) - F_N(\mu, n)|^2].$$

As is well known, the echo-planar method can be realized even when a field gradient is driven by a sinusoidal wave. In this case, the driving waveform is $G_x \cos \omega t$. It is apparent that the present invention can also be used in such a case. However, $\eta$ in the equation (12) is not $\eta = (G_y/G_x k_x)$ but should be $$\eta = (\gamma G_y/\omega) \arcsin [(\omega/\gamma G_x) k_x].$$

Figure 7:
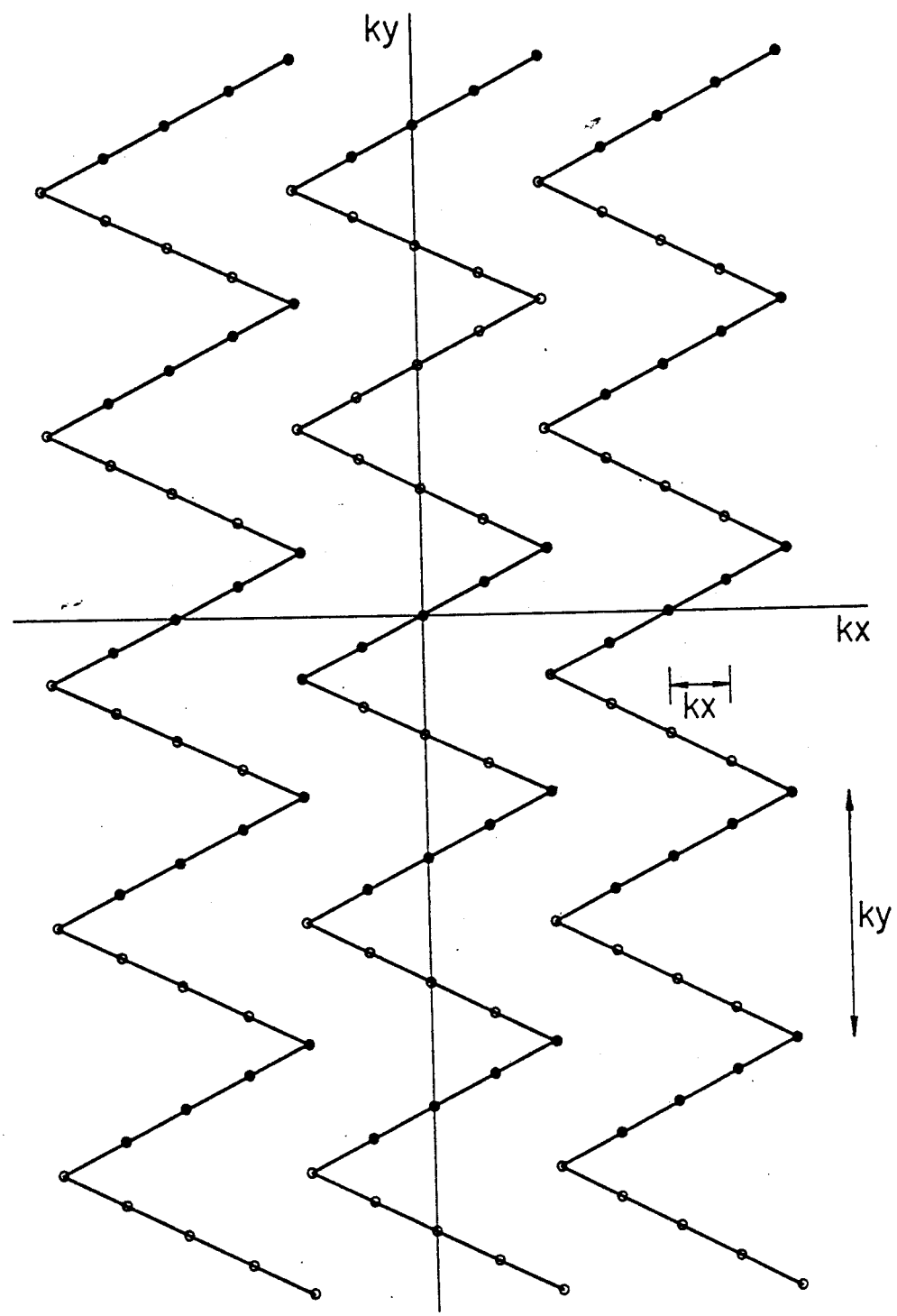
FIG. 7 is a conceptual view showing the trajectories in the k-space of data points obtained in another embodiment of the present invention.

The foregoing embodiment has been explained in conjunction with the case where the present invention is applied to the original echo-planar method. However, the present invention can be applied to the fast Fourier imaging as explained before. FIG. 7 shows the k-trajectory of data points in the fast Fourier imaging in the case where three echo trains are combined. Among these data trains, a data train in the center of FIG. 7 is obtained by the measurement sequence of FIG. 3 which has already been explained. A data train on the left side of FIG. 7 is obtained by a measurement sequence which is similar to the measurement sequence of FIG. 3 but has a field gradient $G_{xe1}$ (shown by dotted line in FIG. 3) to be applied prior to the application of the oscillating field gradient $G_x$ shown by solid line in FIG. 3. A data train on the right side of FIG. 7 is obtained by a measurement sequence which is similar to the measurement sequence of FIG. 3 but has a field gradient $G_{xe2}$ (shown by dotted line) to be applied preliminarily. Namely, in the present embodiment, three kinds of phase encodings are conducted and a measurement sequence similar to that in the echo-planar method is repeated.

In the case where the present invention is not used, the interval $\Delta k_y$ between white-marked (or black-marked) data points in FIG. 7 in the $k_y$ direction should be $$\Delta k_y = \frac{2\pi}{L_y}$$

where $L_y$ is the width of a field of view in the y direction. However, when the present invention is used, it is apparent that an image can be reconstructed if $$\Delta k_y = \frac{4\pi}{L_y}$$

is satisfied.

The present invention is also applicable to a recently proposed fast spectroscopic imaging method using an oscillating field gradient (see "Spatially Resolved NMR Spectroscopy Using Phase-Modulated Spin-Echo Trains", Journal of Magnetic Resonance, Vol. 67, No. 3, pp. 476–490, 1986). In the spectroscopic imaging, the field gradient $G_y$ in the y direction applied upon measurement in the sequence shown in FIG. 3 is zero so that a train of echoes reflecting the inverting or oscillating field gradient $G_x$ and chemical shifts of nuclear spins is measured. Accordingly, an actual measurement data train having the k-trajectory the gradient of which is similar to the gradient shown in FIG. 1A is obtained in a k-space including the spatial frequency axis $k_x$ in the x direction and the frequency axis k. Therefore, a one-dimensional image having a chemical shift axis and an x axis as coordinate axes is obtained by calculating an index indicative of the degree of coincidence of a virtual measurement data train determined from a trial image with the actual measurement data train and successively modifying the trial image so that the value of that index becomes small, in the same manner as explained above. When it is desired to obtain a three-dimensional image including the distribution of spins in the y-axis direction, the measurement is repeatedly carried out by use of phase-encoding field gradients in the y direction having different values or amplitudes for the respective measurements, the modification of a trial image as mentioned above is successively made for every result of measurement and a plurality of two-dimentional images thus obtained are subjected to Fourier transformation in the y direction. Alternatively, the three-dimensional spin distribution including the chemical shift axis may be obtained by calculating a virtual measurement data train from a three-dimensional trial image and successively modifying the three-dimensional trial image on the basis of a difference between the virtual measurement data train and the actual measurement data train.

We claim:

1. An image reconstruction method in a nuclear magnetic resonance imaging system comprising magnetic field generating means for generating a static magnetic field, field gradients and an RF magnetic field, signal detecting means for detecting a nuclear magnetic resonance signal from an object to be examined, a computer for performing an operation on a signal detected by said signal detecting means, and output means for outputting the results of operation by said computer, said method comprising:
   (i) a step of detecting the nuclear magnetic resonance signal after nuclear spins in a predetermined space including said object to be examined have been excited and in a state in which there exist a first field gradient along a first direction of said predetermined space which is temporarily steady and a second field gradient along a second direction of said predetermined space which has a sense periodically inverted, thereby obtaining an actual measurement data train having on a k-space a k-trajectory which has a gradient caused by said first and second field gradients;
   (ii) a step of subjecting a predetermined trial image m(I, J) to a phase shift $\xi(\mu, J)$ corresponding to the gradient of said k-trajectory and thereafter to inverse Fourier transformation, thereby obtaining a first virtual measurement data train $M_P(\mu, \nu)$;
   (iii) a step of subjecting a version of said trial image m(I, J) having an inverted sign of I to said phase shift $\xi(\mu, J)$ and thereafter to inverse Fourier transformation, thereby obtaining a second virtual measurement data train $M_N(\mu, \nu)$;
   (iv) a step of determining a difference ($M_P$-$F_P$) between each of data in said actual measurement data train in periods when said second field gradient is positive and data in said first virtual measurement data train at a position on said k-space corresponding thereto and a difference ($M_N - F_N$) between each of data in said actual measurement data train in periods when said second field gradient is negative and data in said second virtual measurement data train at a position on said k-space corresponding thereto and making the sum of the absolute values of all of the differences or the sum of squares of the absolute values of all of the differences;
   (v) a step of modifying said trial image m(I, J) so that said sum of the absolute values of the differences or said sum of squares of the absolute values of the differences becomes small; and
   (vi) a step of repeating said steps (i) to (v) to obtain an estimated image representative of the distribution of nuclear spins in said predetermined space.

2. An image reconstruction method according to claim 1, wherein said second field gradient is a magnetic field oscillating in a rectangular waveform and said phase shift $\xi(\mu, J)$ is $$\xi(\mu, J) = 2\pi \frac{\Delta y}{L_x}\left(J - \frac{M}{2}\right)\left(\mu - \frac{M}{2}\right)$$

where $L_x$ is the size of a field of view in said first direction, $\Delta y$ is the size of a pixel in said second direction and M is the number of pixels in said first direction.

3. An image reconstruction method according to claim 1, wherein said second field gradient is a magnetic field oscillating in a sinusoidal waveform represented by $G_x \cos \omega t$ and said phase shift $\xi(\mu, J)$ is $$\xi(\mu, J) = \eta \Delta y \left(J - \frac{M}{2}\right)$$

where $\eta = (\gamma G_y/\omega)$ arcsin $[(\omega/\gamma G_x)k_x]$, $\gamma$ being the gyromagnetic ratio, $G_y$ being the amplitude of said first field gradient and $k_x$ being the spatial angular frequency in said second direction.

4. An image reconstruction method according to claim 1, wherein the modification of said trial image m(I, J) is made in such a manner that each of said differences ($M_P-F_P$) and ($M_N-F_N$) is subjected to another phase shift $-\xi(\mu, J)$ having a sign reverse to said phase shift $\xi(\mu, J)$ and thereafter to Fourier transformation, the results of the respective Fourier transformations are added to determine A(I, J) and the respective m(I, J) are modified in the direction of a gradient calculated in a form including A(I, J).

5. An image reconstruction method in a nuclear magnetic resonance imaging system comprising magnetic field generating means for generating a static magnetic field, field gradients and an RF magnetic field, signal detecting means for detecting a nuclear magnetic resonance signal from an object to be examined, a computer for performing an operation on a signal detected by said signal detecting means, and output means for outputting the results of operation by said computer, said method comprising:
   (i) a step of detecting the nuclear magnetic resonance signal after nuclear spins in a predetermined space including said object to be examined have been excited and in a state in which a first field gradient along a first direction of said predetermined space is zero and a second field gradient along a second direction of said predetermined space having a sense periodically inverted exists, thereby obtaining an actual measurement data train having on a k-space a k-trajectory which has a gradient caused by a chemical shift of said nuclear spins and said second field gradient;
   (ii) a step of subjecting a predetermined trial image m(I, J) in an orthogonal coordinate system to a phase shift $\xi(\eta, J)$ corresponding to the gradient of said k-trajectory and thereafter to inverse Fourier transformation, thereby obtaining a first virtual measurement data train $M_P(\mu, \nu)$;
   (iii) a step of subjecting a version of said trial image m(I, J) having an inverted sign of I to said phase shift $\xi(\mu, J)$ and thereafter to inverse Fourier transformation, thereby obtaining a second virtual measurement data train $M_N(\mu, \nu)$;
   (iv) a step of determining a difference ($M_P-F_P$) between each of data in said actual measurement data train in periods when said second field gradient is positive and data in said first virtual measurement data train at a position on said k-space corresponding thereto and a difference ($M_N-F_N$) between each of data in said actual measurement data train in periods when said second field gradient is negative and data in said second virtual measurement data train at a position on said k-space corresponding thereto and making the sum of the absolute values of all of the differences or the sum of squares of the absolute values of all of the differences;

(v) a step of modifying said trial image m(I, J) so that said sum of the absolute values of the differences or said sum of squares of the absolute values of the differences becomes small; and (vi) a step of repeating said steps (i) to (v) to obtain an estimated image representative of the distribution of nuclear spins in said predetermined space having an axis of said second direction and a chemical shift axis as coordinate axes.

* * * * *